United States Patent
Heo et al.

(10) Patent No.: US 9,537,045 B2
(45) Date of Patent: Jan. 3, 2017

(54) SEMICONDUCTOR DEVICE AND METHOD OF FABRICATING THE SAME

(71) Applicant: Seoul Viosys Co., Ltd., Ansan-si (KR)

(72) Inventors: Jeong Hun Heo, Ansan-si (KR); Yeo Jin Yoon, Ansan-si (KR); Joo Won Choi, Ansan-si (KR); Joon Hee Lee, Ansan-si (KR); Chang Yeon Kim, Ansan-si (KR); Su Young Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/796,421

(22) Filed: Jul. 10, 2015

(65) Prior Publication Data

US 2015/0311384 A1 Oct. 29, 2015

Related U.S. Application Data

(62) Division of application No. 14/053,098, filed on Oct. 14, 2013, now Pat. No. 9,111,840.

(30) Foreign Application Priority Data

Oct. 15, 2012 (KR) ........................ 10-2012-0114130
Oct. 15, 2012 (KR) ........................ 10-2012-0114133

(51) Int. Cl.
*H01L 29/20* (2006.01)
*H01L 33/00* (2010.01)
(Continued)

(52) U.S. Cl.
CPC ......... *H01L 33/0075* (2013.01); *H01L 27/156* (2013.01); *H01L 33/62* (2013.01);
(Continued)

(58) Field of Classification Search
CPC ................... H01L 33/62; H01L 27/153; H01L 2224/48137; H01L 33/0075; H01L 27/156
See application file for complete search history.

(56) References Cited

U.S. PATENT DOCUMENTS 6,284,670 B1 9/2001 Abe et al.
8,269,228 B2 9/2012 Lee et al.
(Continued)

FOREIGN PATENT DOCUMENTS

JP 11-251631 9/1999
JP 2010-147165 7/2010
(Continued)

OTHER PUBLICATIONS

International Search Report issued on Jan. 21, 2014 in International Application No. PCT/KR2013/009055.
(Continued)

*Primary Examiner* — John C Ingham
(74) *Attorney, Agent, or Firm* — H.C. Park & Associates, PLC

(57) ABSTRACT

A method of fabricating a semiconductor device includes forming an insulation pattern including a mask region and an open region on a gallium nitride substrate, growing gallium nitride semiconductor layers to cover the insulation pattern, and patterning the semiconductor layers to form a plurality of semiconductor stacks separated from each other, the plurality of semiconductor stacks being electrically isolated from the gallium nitride substrate by the insulation pattern.

14 Claims, 15 Drawing Sheets

(51) Int. Cl.
*H01L 27/15* (2006.01)
*H01L 33/62* (2010.01)

(52) U.S. Cl.
CPC ............ *H01L 2924/0002* (2013.01); *H01L 2933/0033* (2013.01); *H01L 2933/0066* (2013.01)

(56) References Cited

U.S. PATENT DOCUMENTS

| | | | |
|---|---|---|---|
| 9,059,012 B2* | 6/2015 | Jang | H01L 21/0237 |
| 9,093,293 B2* | 7/2015 | Ibbetson | H01L 25/0753 |
| 2006/0270076 A1 | 11/2006 | Imer et al. | |
| 2008/0197363 A1 | 8/2008 | Lee et al. | |
| 2009/0302334 A1 | 12/2009 | Yao et al. | |
| 2010/0006867 A1* | 1/2010 | Lee | H01L 27/15 257/88 |
| 2010/0072905 A1 | 3/2010 | Kim et al. | |
| 2010/0117056 A1 | 5/2010 | Nagai | |
| 2011/0233734 A1 | 9/2011 | Wells | |

FOREIGN PATENT DOCUMENTS

| | | |
|---|---|---|
| KR | 10-2006-0090446 | 8/2006 |
| KR | 10-2009-0036374 | 4/2009 |

OTHER PUBLICATIONS

Written Opinion issued on Jan. 21, 2014 in International Application No. PCT/KR2013/009055.
Non-Final Office Action issued Jan. 14, 2015, in U.S. Appl. No. 14/053,098.
Notice of Allowance issued Apr. 14, 2015, in U.S. Appl. No. 14/053,098.

* cited by examiner

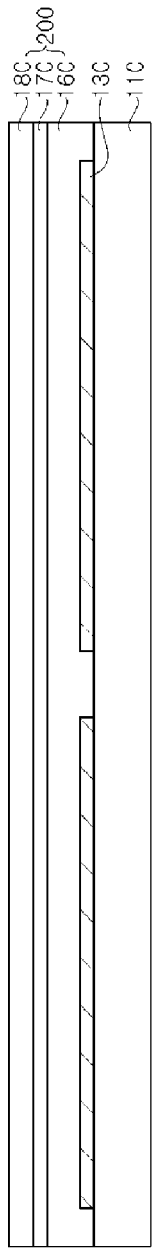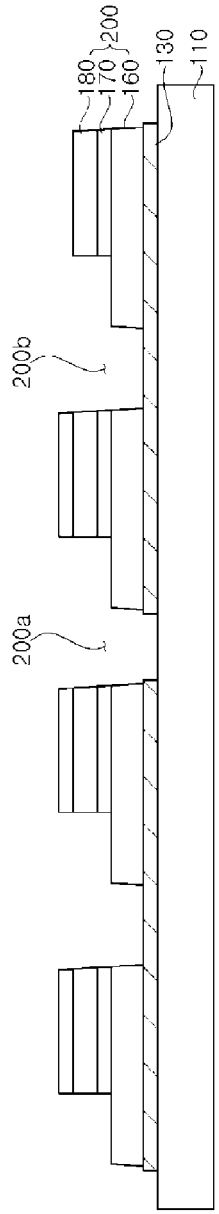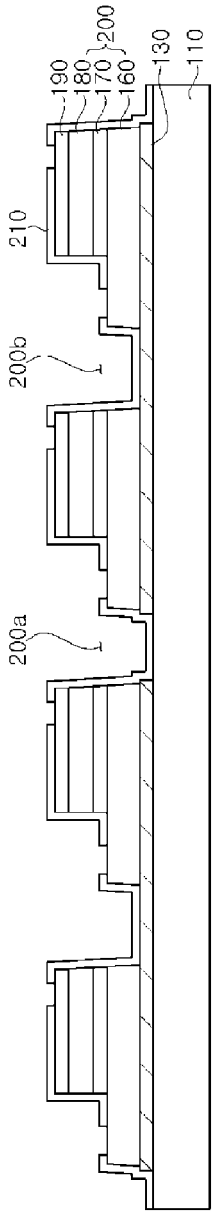

SEMICONDUCTOR DEVICE AND METHOD OF FABRICATING THE SAME

CROSS-REFERENCE TO RELATED APPLICATIONS

This application is a divisional of U.S. patent application Ser. No. 14/053,098, filed on Oct. 14, 2013, and claims priority from and the benefit of Korean Patent Application No. 10-2012-0114130, filed on Oct. 15, 2012, and Korean Patent Application No. 10-2012-0114133, filed on Oct. 15, 2012, all of which are hereby incorporated by reference for all purposes as if fully set forth herein.

BACKGROUND

Field

The present invention relates to a semiconductor device and a method of fabricating the same, and more particularly, to a semiconductor device having an insulation structure for insulating a semiconductor stack from a substrate and a method of fabricating the same.

Discussion of the Background

Gallium nitride compound semiconductors may be used in visible or ultraviolet (UV) light emitting devices, high power electronic devices, and the like. A gallium nitride compound semiconductor layer is generally grown on a substrate by a growth technique such as molecular beam epitaxy (MBE), metal-organic chemical vapor deposition (MOCVD) or hydride vapor phase epitaxy (HVPE).

Generally, a gallium nitride compound semiconductor may be grown on a heterogeneous substrate such as a sapphire substrate. When a semiconductor stack is grown on the sapphire substrate, various semiconductor devices may be fabricated using the semiconductor stack.

Recently, a light emitting device may be fabricated by connecting a plurality of semiconductor stacks to each other in series via an interconnection wire on a single substrate for high voltage operation. Such a light emitting device may be formed using an insulating substrate such as a sapphire substrate as a growth substrate. Thus, electric isolation between the semiconductor stacks may be relatively easily achieved by patterning semiconductor layers grown on the growth substrate such that the substrate can be exposed therethrough.

However, a semiconductor stack grown on a sapphire substrate may have a relatively high crystal defect density. Moreover, a gallium nitride compound semiconductor grown in a C-axis direction on a sapphire substrate having a c-plane as a growth plane may exhibit polarity by spontaneous polarization and piezoelectric polarization, and provide low recombination rate between holes and electrons, thereby limiting improvement in luminous efficacy.

Recently, in order to overcome such problems of the sapphire substrate, a technique of growing a gallium nitride compound semiconductor using a gallium nitride substrate as a growth substrate has been developed. In this case, since a homogeneous substrate, that is, the gallium nitride substrate, is used as the growth substrate, it is possible to achieve significant reduction in crystal defect density. Furthermore, when a non-polar or semi-polar gallium nitride substrate is used as the growth substrate, a non-polar or semi-polar gallium nitride compound semiconductor may be grown to have good crystallinity, thereby solving problems caused by polarization.

However, the gallium nitride substrate has electrical conductivity, unlike the sapphire substrate. Even when a relatively high resistance gallium nitride substrate is fabricated, the gallium nitride substrate may be much thicker than a semiconductor stack, so that substantial current leakage occurs through the gallium nitride substrate. Accordingly, in order to connect a plurality of semiconductor stacks to each other in series on an electrically conductivity-substrate such as a gallium nitride substrate, it is necessary to insulate the plurality of semiconductor stacks from the substrate.

In order to insulate the gallium nitride substrate from the semiconductor stack, a gallium nitride semi-insulation layer formed by counter doping of a p-type impurity may be used. However, counter doping of the p-type impurity may have a limit in formation of a uniform insulation layer. Moreover, since the semi-insulation layer may not provide complete blocking of electric current, current leakage may easily occur through the semi-insulation layer.

On the other hand, when a plurality of semiconductor chips grown on a gallium nitride substrate is mounted on a printed substrate or the like, electrical conductivity of the gallium nitride substrate may result in a short circuit between the semiconductor chips due to current leakage through the gallium nitride substrate.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a semiconductor device capable of blocking current leakage through a gallium nitride substrate, and a method of fabricating the same.

Exemplary embodiments of the present invention also provide a semiconductor device capable of blocking current leakage from a semiconductor stack to a substrate, in particular, to a gallium nitride substrate, and a method of fabricating the same.

Exemplary embodiments of the present invention also provide a semiconductor device having an insulation structure capable of insulating a semiconductor stack from a substrate, and a method of fabricating the same.

Exemplary embodiments of the present invention also provide a semiconductor device, particularly, a light emitting device, including a plurality of semiconductor stacks connected to each other in series using a GaN substrate as a growth substrate.

Additional features of the invention will be set forth in the description which follows, and in part will be apparent from the description, or may be learned by practice of the invention.

An exemplary embodiment of the invention discloses a semiconductor device including a gallium nitride substrate, a plurality of semiconductor stacks disclosed on the gallium nitride substrate, and an insulation pattern disposed between the gallium nitride substrate and the plurality of semiconductor stacks, the insulation pattern insulating the semiconductor stacks from the gallium nitride substrate.

An exemplary embodiment of the present invention also discloses a method of fabricating a semiconductor device, the method including forming an insulation pattern having a mask region and an open region on a gallium nitride substrate, growing gallium nitride semiconductor layers to cover the insulation pattern, and patterning the semiconductor layers to form a plurality of semiconductor stacks separated from each other. The plurality of semiconductor stacks is electrically insulated from the gallium nitride substrate by the insulation pattern.

An exemplary embodiment of the present invention also discloses a semiconductor device including a plurality of semiconductor chips disposed on a chip-mounting substrate, and an insulation layer disposed between the plurality of semiconductor chips and the chip-mounting substrate to insulate the plurality of semiconductor chips from the chip-mounting substrate. Each of the plurality of semiconductor chips includes a gallium nitride substrate and a gallium nitride semiconductor stack disposed on the gallium nitride substrate.

An exemplary embodiment of the present invention also discloses a semiconductor device including a gallium nitride semiconductor stack disposed on a substrate, and an insulation structure disposed between the substrate and the semiconductor stack, the insulating structure insulating the semiconductor stack from the substrate. The insulation structure includes a mask pattern having a mask region and an open region, and a cavity disposed in the open region of the mask pattern.

An exemplary embodiment of the present invention also discloses a method of fabricating a semiconductor device including a growth substrate and a gallium nitride semiconductor stack spaced apart from the growth substrate. The method includes forming a sacrificial layer and a mask pattern on a growth substrate, the mask pattern having a mask region and an open region, the sacrificial layer being exposed to the open region of the mask pattern, etching the sacrificial layer by electrochemical etching (ECE), and growing the gallium nitride semiconductor stack to cover the mask pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 6(a)-(c) show sectional views illustrating a method of fabricating a semiconductor device in accordance with the second exemplary embodiment.

DETAILED DESCRIPTION OF THE ILLUSTRATED EMBODIMENTS

Figure 1:
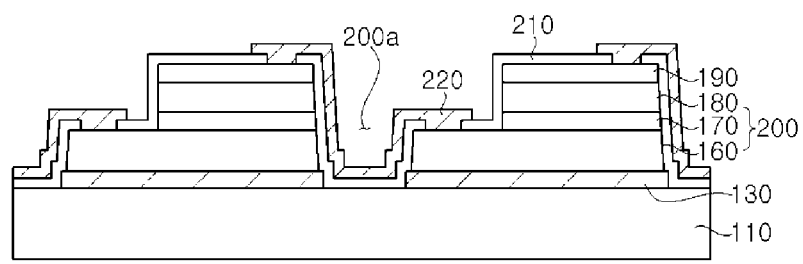
FIG. 1 is a sectional view of a semiconductor device in accordance with a first exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIG. 1 is a sectional view of a semiconductor device in accordance with a first exemplary embodiment of the present invention.

Referring to FIG. 1, the semiconductor device according to the present exemplary embodiment includes a substrate 110, an insulation pattern 130, and a semiconductor stack 200. The semiconductor device may further include a transparent electrode layer 190, an insulation layer 210, and an interconnection wire 220.

The substrate 110 is a growth substrate, particularly, a gallium nitride substrate, which is used to grow a gallium nitride semiconductor. The gallium nitride substrate is a polar substrate having a c-plane as a growth plane, a non-polar substrate having a non-polar growth plane such as an a-plane or an m-plane, or a semi-polar substrate having a semi-polar growth plane such as (20-21), (20-2-1), (10-11), (10-1-1), (11-22), (11-2-2), (30-31), (30-3-1), and the like.

The semiconductor stack 200 is disposed on the substrate 110. The semiconductor stack 200 has an inclined side surface, the width of which gradually decreases upwards. The inclined side surface enhances reliability of the interconnection wire 220 while improving light extraction efficiency. On the other hand, as shown in FIG. 1, a plurality of semiconductor stacks 200 may be disposed on a single substrate 110 and separated from each other by a cell dividing region 200a. The semiconductor stack 200 includes gallium nitride semiconductor layers grown on the substrate 110. In particular, the semiconductor stack 200 may include a first nitride semiconductor layer 160, an active layer 170, and a second nitride semiconductor layer 180.

The first nitride semiconductor layer 160 may be a nitride semiconductor layer doped with a first conductivity-conductivity-type impurity, for example, a Group III-N based compound semiconductor layer doped with an n-type impurity, such as an (Al, In, Ga)N based nitride semiconductor layer, and may include a gallium nitride layer. In addition, the first nitride semiconductor layer 160 may include an un-doped layer.

The active layer 170 may be a Group III-N based compound semiconductor layer, for example, an (Al, Ga, In)N semiconductor layer, and may have a single quantum-well structure or a multi-quantum well structure having well layers (not shown) and barrier layers (not shown) alternately stacked one above another.

The second nitride semiconductor layer 180 may be a Group III-N based compound semiconductor layer doped with a second conductivity-conductivity-type impurity, for example, a p-type impurity, such as an (Al, Ga, In)N-based Group III-nitride semiconductor layer, and may include, for example, a GaN layer.

The insulation pattern 130 is disposed between the substrate 110 and the semiconductor stack 200, and electrically isolates the semiconductor stack 200 from the substrate 110. The insulation pattern 130 includes a mask region and an open region, and the semiconductor stack 200 is disposed on the mask region. As shown in FIG. 1, the mask region may have a greater width than the semiconductor stack 200, and thus, an edge of the mask region may protrude from the semiconductor stack 200. Alternatively, the mask region and the semiconductor stack 200 may have the same width.

The insulation pattern 130 may be a mesh pattern, stripe pattern, or island pattern. The insulation pattern 130 is formed of an insulating material, for example, $SiO_2$ or SiN. When the insulation pattern 130 is a mesh pattern, the mask regions are connected to each other, and the plurality of semiconductor stacks 200 is disposed on the same mask region. When the insulation pattern 130 is a stripe pattern, the plural semiconductor stacks 200 are disposed on different stripes, respectively, and may also be disposed on the same stripe. When the insulation pattern 130 is an island pattern, the semiconductor stacks 200 are disposed on the respective islands.

The cell dividing region 200a divides the semiconductor stack 200 into a plurality of cell regions. The cell dividing region 200a is disposed to expose the open regions of the insulation pattern 130.

Although two semiconductor stacks 200 are shown in the present exemplary embodiment, the semiconductor stack may be divided into a greater number of semiconductor stacks by the cell dividing region 200a.

At least one interconnection wire 220 may electrically connect the separated semiconductor stacks 200 to each other. As shown in FIG. 1, the interconnection wire 220 may connect the semiconductor stacks 200 to each other in series. In other words, the interconnection wire 220 is electrically connected at one end thereof to the first nitride semiconductor layer 160 of one semiconductor stack 200, and at the other end thereof to the second nitride semiconductor layer 180 of another semiconductor stack 200. In such a way, two or more semiconductor stacks 200 may be electrically connected to each other, thereby providing a serial array of semiconductor stacks capable of being driven at a high voltage on a single substrate 110. Connection of the semiconductor stacks 200 to each other via the interconnection wire 220 will be described in more detail with reference to FIG. 2 and FIG. 3.

The transparent electrode layer 190 may be disposed on the semiconductor stack 200, for example, on the second nitride semiconductor layer 180. The transparent electrode layer 190 is electrically connected to the second nitride semiconductor layer 180. The interconnection wire 220 may be electrically connected at one end thereof to the second nitride semiconductor layer 180 via the transparent electrode layer 190.

In order to prevent a short circuit between the interconnection wire 220 and the semiconductor stack 200, the insulation layer 210 may be interposed between the semiconductor stack 200 and the interconnection wire 220. In addition, the insulation layer 210 may be interposed between the interconnection wire 220 and the substrate 110 in the open region of the insulation pattern 130 to prevent short circuit between the interconnection wire 220 and the substrate 110.

Figure 2:
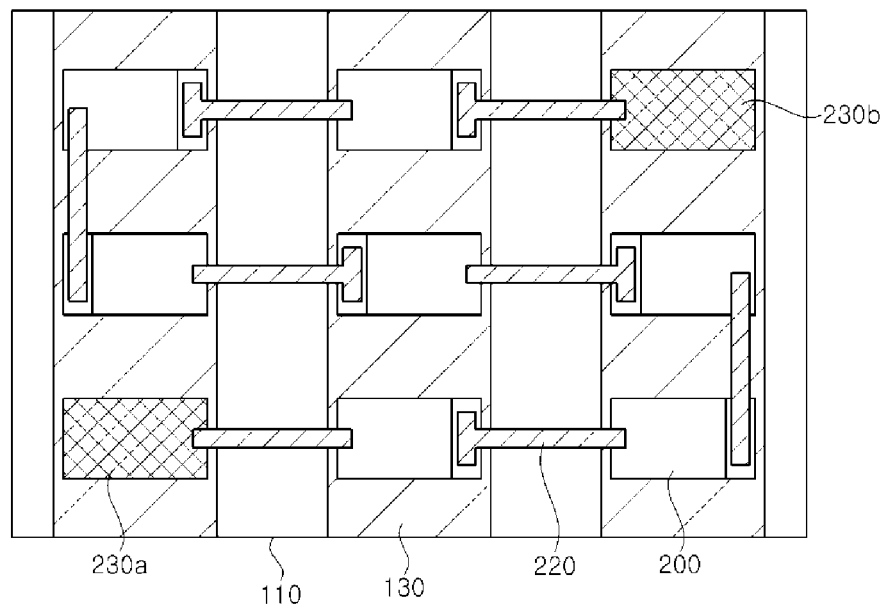
FIG. 2 and FIG. 3 are plan views of semiconductor stacks connected to each other in series in accordance with the first exemplary embodiment.
Figure 3:
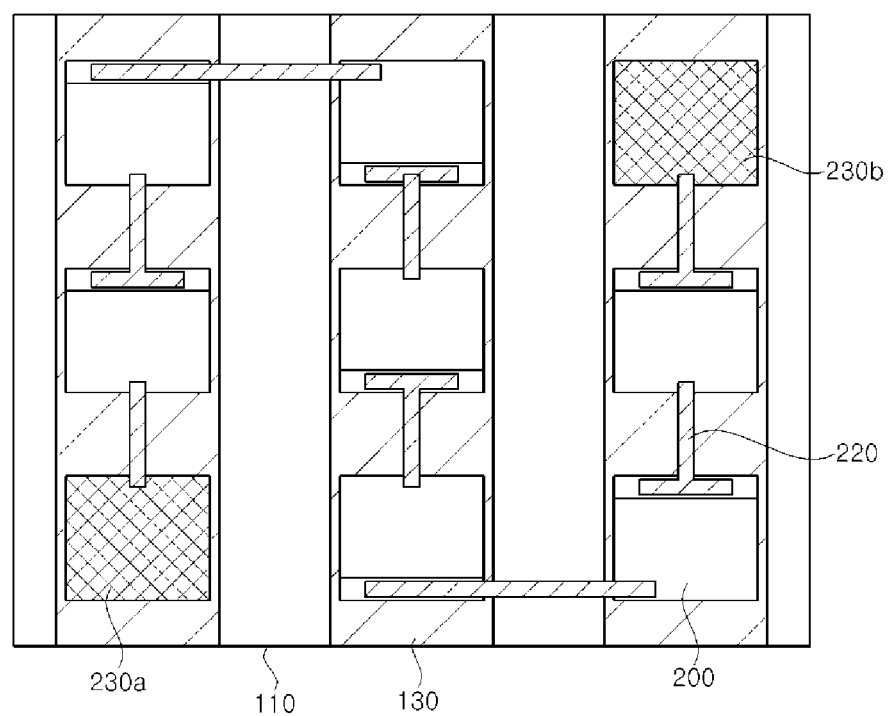

FIGS. 2 and 3 are plan views of semiconductor stacks connected to each other in series by an interconnection wire in accordance with the first exemplary embodiment.

Referring to FIGS. 2 and 3, a stripe insulation pattern 130 is disposed on the substrate 110, and the semiconductor stacks 200 are disposed on each of stripes. In addition, electrode pads 230a, 230b may be disposed on the stripes. Interconnection wires 220 electrically connect the semiconductor stacks 200 to each other. For convenience of description, the transparent electrode layer 190 and the insulation layer 210 are not shown.

The interconnection wires 220 connect the electrode pads 230a and 230b to the semiconductor stacks 200 to form a serial array of semiconductor stacks 200 on the substrate 110. The electrode pads 230a and 230b are disposed at opposite ends of the serial array, respectively. Here, some of the interconnection wires 220 connect the semiconductor stacks 200 on different stripes to each other, and the others of the interconnection wires 220 connect the semiconductor stacks 200 on the same stripes to each other. In the exemplary embodiment of FIG. 2, the number of interconnection wires 220 connecting the semiconductor stacks 200 on the different stripes to each other is greater than the number of interconnection wires 220 connecting the semiconductor stacks 200 on the same stripes to each other. On the contrary, in the exemplary embodiment of FIG. 3, the number of interconnection wires 220 connecting the semiconductor stacks 200 on the same stripes to each other is greater than the number of interconnection wires 220 connecting the semiconductor stacks 200 on the different stripes to each other. Most interconnection wires 220 are formed on the stripes, whereby disconnection of the interconnection wires 220 can be prevented, thereby improving reliability.

Although the insulation pattern 130 is illustrated as a stripe pattern in FIGS. 2 and 3, the insulation pattern 130 may be a mesh pattern, as described above, and in this case, all of the interconnection wires 220 may be disposed on the mask regions. In addition, the insulation pattern 130 may be an island pattern, and in this case, the interconnection wires 220 may connect the semiconductor stacks 200 disposed on different mask regions to each other.

According to the present exemplary embodiment, the insulation pattern 130 electrically insulates the semiconductor stacks 200 from the growth substrate 110. Thus, when a conductivity-substrate such as a gallium nitride substrate is used as the growth substrate, it is possible to electrically insulate the semiconductor stacks 200 from the substrate 110. As a result, it is possible to prevent current leakage from the semiconductor stacks 200 to the substrate 110, thereby providing a light emitting device capable of being driven at high voltage by connecting the plurality of semiconductor stacks 200 to each other.

FIG. 4 shows sectional views illustrating a method of fabricating a semiconductor device in accordance with the first exemplary embodiment.

Figure 4A:
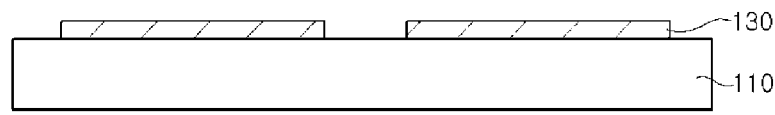
FIGS. 4(a)-(d) show sectional views illustrating a method of fabricating a semiconductor device in accordance with the first exemplary embodiment.

First, referring to FIG. 4(a), a growth substrate 110 is prepared. The growth substrate 110 may be a polar, non-polar, or semi-polar GaN substrate.

An insulation pattern 130 is formed on the growth substrate 110. The insulation pattern 130 is formed of an insulating material, for example, SiO$_2$ or SiN. The insulation pattern 130 has a mask region and an open region. The insulation pattern 130 may be a mesh pattern, a stripe pattern, or an island pattern.

Figure 4B:
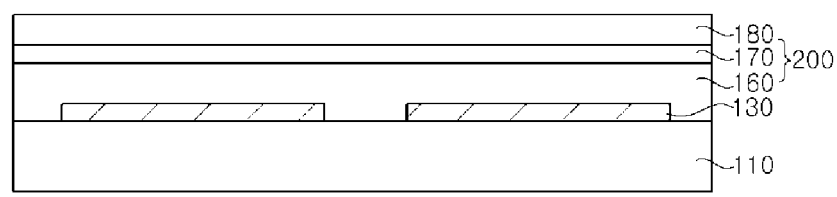

Referring to FIG. 4(b), a gallium nitride semiconductor stack 200 is grown from regions of the growth substrate 110 exposed by the open region of the insulation pattern 130. The semiconductor stack 200 includes a first nitride semiconductor layer 160, an active layer 170 and a second nitride semiconductor layer 180. The semiconductor stack 200 covers the mask region of the insulation pattern 130 by epitaxial lateral overgrowth (ELOG). As a result, portions of the semiconductor layers 160, 170, 180 having a high density of crystal defects such as threading dislocations Dl are grown on the open region of the insulation pattern 130, and portions of the semiconductor layers 160, 170, 180 having high crystal quality are grown on the mask region.

The first nitride semiconductor layer 160 may be a nitride semiconductor layer doped with a first conductivity-type impurity, for example, a Group III-N based compound semiconductor layer doped with an n-type impurity, such as an (Al, In, Ga)N based nitride semiconductor layer, and may include a gallium nitride layer. In addition, the first nitride semiconductor layer 160 may include an un-doped layer.

The active layer 170 may be a Group III-N based compound semiconductor layer, for example, an (Al, Ga, In)N semiconductor layer, and may have a single quantum-well structure or a multi-quantum well structure having well layers (not shown) and barrier layers (not shown) alternately stacked one above another.

The second nitride semiconductor layer 180 may be a Group III-N based compound semiconductor layer doped with a second conductivity-type impurity, for example, a p-type impurity, such as an (Al, Ga, In)N-based Group III-nitride semiconductor layer, and may include, for example, a GaN layer.

Figure 4C:
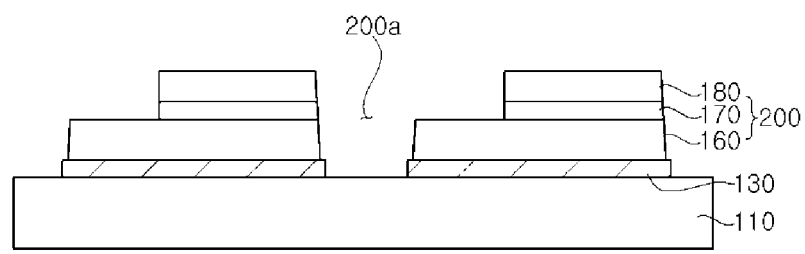

Referring to FIG. 4(c), the grown semiconductor stack 200 is subjected to patterning to form a cell dividing region 200a. The cell dividing region 200a may be formed by photolithography and etching. A plurality of semiconductor stacks 200 is divided into a plurality of cell regions by the cell dividing region 200a.

As shown, the cell dividing region 200a exposes the open region of the insulation pattern 130. That is, the semiconductor layer 160 within the open region is removed by patterning. As a result, all of the plural semiconductor stacks 200 are insulated from the substrate 110. On the other hand, the surface of the substrate 110 under the open region may be exposed to the cell dividing region 200a. If the mask region has a stripe shape, the cell dividing region 200a is formed to intersect the stripe-shaped mask regions, thereby delimiting the plurality of semiconductor stacks 200.

In addition, the second nitride semiconductor layer 180 and the active layer 170 of each of the semiconductor stacks 200 are partially etched, thereby allowing partial exposure of an upper surface of the first nitride semiconductor layer 160. A process of exposing the upper surface of the first nitride semiconductor layer 160 may be carried out before or after forming the cell dividing region 200a.

Figure 4D:
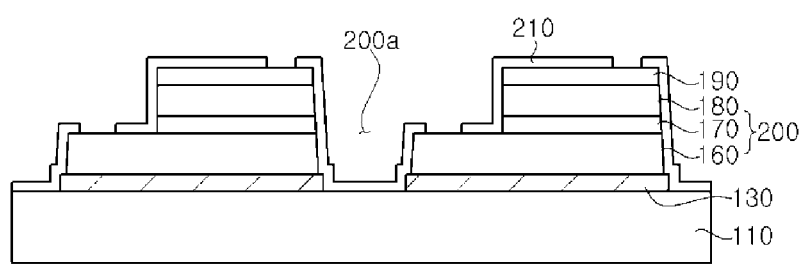

Referring to FIG. 4(d), a transparent electrode layer 190 may be formed on the second nitride semiconductor layer 180. The transparent electrode layer 190 may be formed of a transparent oxide such as indium tin oxide (ITO), or a metallic material such as Ni/Au.

Although the transparent electrode layer 190 is illustrated as being formed after division of the semiconductor stack 200 and partial exposure of the upper surface of the first nitride semiconductor layer 160 in the present exemplary embodiment, the transparent electrode layer 190 may be formed before division of the semiconductor stack 200, and before exposure of the upper surface of the first nitride semiconductor layer 160.

An insulation layer 210 covering side surfaces of the semiconductor stacks 200 may be formed. The insulation layer 210 may also cover the surface of the substrate 110, and may partially cover the transparent electrode layer 190. Here, the insulation layer 210 is formed to expose at least a portion of the upper surface of the first nitride semiconductor layer 160 and at least a portion of an upper surface of the transparent electrode layer 190.

Then, as shown in FIG. 1, interconnection wires 220 connecting the semiconductor stacks 200 to each other in series are formed. The interconnection wires 220 are formed on the insulation layer 210, and are isolated from the side surfaces of the semiconductor stacks 200 and the substrate 110. Each of the interconnection wires 220 is electrically connected at one end thereof to the first nitride semiconductor layer 160 of one semiconductor stack 200, and at the other end thereof to the second nitride semiconductor layer 180 of another semiconductor stack 200.

By the interconnection wires 220, the plurality of semiconductor stacks 200 may be connected to each other in various ways, as described with reference to FIG. 2 and FIG. 3. Accordingly, on a single substrate 110, various types of connections, such as series connection, parallel connection, reverse parallel connection, or series-parallel combination connection, and the like, may be achieved between the plural semiconductor stacks 200. A semiconductor device having the plurality of semiconductor stacks 200, for example, a light emitting device, may be fabricated by dividing the substrate 110 such that such a plurality of semiconductor stacks 200 can be included therein.

Figure 5:
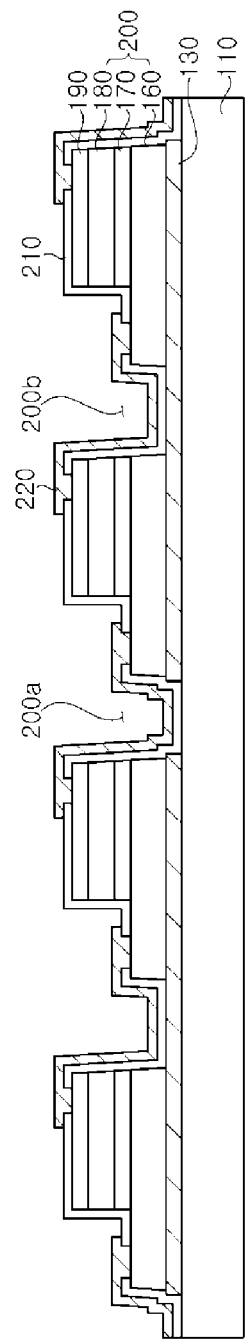
FIG. 5 is a sectional view of a semiconductor device in accordance with a second exemplary embodiment of the present invention.

FIG. 5 is a sectional view of a semiconductor device in accordance with a second exemplary embodiment of the present invention.

The semiconductor device according to the present exemplary embodiment is generally similar to the semiconductor device of FIG. 1, except that the semiconductor stack 200 is additionally divided on mask regions of an insulation pattern 130 by a cell dividing region 200b. In the present exemplary embodiment, the semiconductor device is shown at a different scale for ease of understanding.

Semiconductor stacks 200 are disposed on the mask regions of the insulation pattern 130. As in the exemplary embodiment of FIG. 1, the cell dividing region 200a divide the semiconductor stacks 200. In addition, on each of the mask regions, a cell dividing region 200b divides the semiconductor stacks 200 from each other. The cell dividing region 200b is disposed at the center of the mask region.

The interconnection wires 220 may connect the semiconductor stacks 200 on the same mask region to each other, or may connect the semiconductor stacks 200 on different mask regions to each other.

As described with reference to FIGS. 1 to 3, the insulation pattern 130 may be a mesh pattern, a stripe pattern, or an island pattern. For example, when the insulation pattern 130 is a stripe pattern as shown in FIG. 2 or FIG. 3, the cell dividing region 200b is formed in a longitudinal direction of a stripe on the stripe-shaped mask region. As a result, two semiconductor stacks 200 are arranged in a direction intersecting the longitudinal direction of the stripes on the same mask region.

When the insulation pattern 130 is an island pattern, two semiconductor stacks 200 are disposed on a single island.

Generally, when the semiconductor layer is grown via epitaxial lateral overgrowth, crystal defect density at the center of the mask region may be increased. According to the present exemplary embodiment, the semiconductor layers having a high crystal defect density are removed from the mask region by the cell dividing region 200b, thereby enhancing device performance.

FIG. 6 shows sectional views illustrating a method of fabricating a semiconductor device in accordance with the second exemplary embodiment of the present invention.

Referring to FIG. 6(a), a growth substrate 110 is prepared, an insulation pattern is formed on the growth substrate 110, and a gallium nitride semiconductor stack 200 is grown to cover the insulation pattern 130, as described with reference to FIGS. 4(a) and (b).

Referring to FIG. 6(b), the grown semiconductor stack 200 is subjected to patterning to form a cell dividing region 200a, as described with reference to FIG. 4(c). In addition, a cell dividing region 200b is also formed to divide the semiconductor stack 200 on the mask region. The cell dividing region 200b may be formed together with the cell dividing region 200a by the same process, without being limited thereto. In other words, the cell dividing region 200b may be formed before or after formation of the cell dividing region 200a. The cell dividing regions 200a, 200b may be formed by photolithography and etching.

The semiconductor layers 160, 170, 180 having a high crystal defect density on the open region of the insulation pattern 130 are removed by the cell dividing region 200a, and the semiconductor layers 160, 170, 180 having a high crystal defect density on the mask region of the insulation pattern 130 are removed by the cell dividing region 200b.

Referring to FIG. 6(c), a transparent electrode layer 190 and an insulation layer 210 are formed as described with reference to FIG. 4(d). The insulation layer 210 covers an exposed surface of the substrate 110 and may cover the exposed mask region. Then, as shown in FIG. 5, interconnection wires 220 are formed. A plurality of semiconductor stacks 200 may be connected to each other in various ways by the interconnection wires 220. A semiconductor device having the plurality of semiconductor stacks 200 as shown in FIG. 5, for example, a light emitting device, may be fabricated by dividing the substrate such that such a plurality of semiconductor stacks 200 can be included therein.

Figure 7:
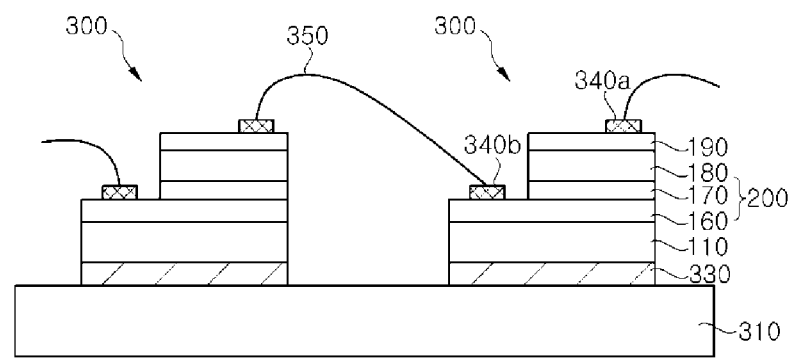
FIG. 7 is a sectional view of a semiconductor device in accordance with a third exemplary embodiment of the present invention.

FIG. 7 is a sectional view of a semiconductor device in accordance with a third exemplary embodiment of the present invention. The aforementioned embodiments disclose techniques of insulating the semiconductor stacks 200 from the gallium nitride substrate 110 at the chip level. The present exemplary embodiment provides a technique of insulating semiconductor chips from a chip mounting substrate at a package level or at a module level.

Referring to FIG. 7, the semiconductor device according to the present exemplary embodiment includes semiconductor chips 300, a chip mounting substrate 310 and an insulation layer 330, and may further include bonding wires 350.

The chip mounting substrate 310 may be a lead frame, a printed circuit board such as an MC-PCB, a ceramic substrate, or the like. The chip mounting substrate 310 may include a printed circuit board or a conductive material such as a reflective metal layer.

Each of the semiconductor chips 300 includes a gallium nitride substrate 110 and a semiconductor stack 200 grown on the gallium nitride substrate 110. In addition, the semiconductor chips 300 may include a transparent electrode layer 190 and electrode pads 340a, 340b. The semiconductor stack 200 may include a first nitride semiconductor layer 160, an active layer 170 and a second nitride semiconductor layer 180, as described with reference to FIG. 1. In the present exemplary embodiment, the semiconductor stack 200 is connected to the gallium nitride substrate 110, and thus, current leakage can occur from the semiconductor stack 200 towards the substrate 110.

The insulation layer 330 is interposed between the semiconductor chip 300 and the chip mounting substrate 310 to insulate the semiconductor chips 300 from the chip mounting substrate 310. The insulation layer 330 may be formed in a mesh pattern, an island pattern, or a stripe pattern. The semiconductor chip 300 is disposed on the insulation layer 330 and separated from the chip mounting substrate 310.

The bonding wire 350 electrically connects the semiconductor chips 300 to each other. The bonding wire 350 may directly connect the semiconductor chips 300 to each other, as shown in FIG. 7. For example, the bonding wire 350 may directly connect an electrode pad 340a disposed on a transparent electrode 19 of a first semiconductor chip 300 to an electrode pad 340b disposed on a first nitride semiconductor layer 160 of a second semiconductor chip 300. Alternatively, one bonding wire 350 may connect the electrode pad 340a of the first semiconductor chip 300 to a bonding pad (not shown) formed on the chip mounting substrate 310, and another bonding wire 350 may connect the electrode pad 340b of the second semiconductor chip 300 to the bonding pad. As a result, two semiconductor chips 300 may be directly connected to each other in series.

In the present exemplary embodiment, each of the semiconductor chips 300 may be a light emitting diode chip. Thus, it is possible to provide a serial array of light emitting diode chips 300 connected to each other in series on the chip mounting substrate 310. However, the semiconductor chips 300 may be other high power electronic devices.

Figure 8:
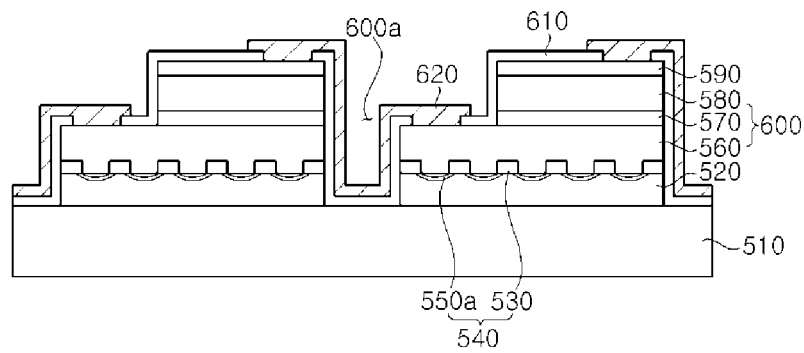
FIG. 8 is a sectional view of a semiconductor device in accordance with a fourth exemplary embodiment of the present invention.

FIG. 8 is a sectional view of a semiconductor device in accordance with a fourth exemplar embodiment of the present invention.

Referring to FIG. 8, the semiconductor device according to the present exemplary embodiment includes a substrate 510, an insulation structure 540, and semiconductor stacks 600. The semiconductor device may further include a sacrificial layer 520, a transparent electrode 590, an insulation layer 610, and an interconnection wire 620.

As the substrate 510, any growth substrate capable of growing gallium nitride semiconductor layers may be used without limitation. In particular, the substrate 510 may be an electrically conductive substrate such as a gallium nitride substrate, silicon substrate, SiC substrate, and the like. Alternatively, the substrate 510 may be an insulating substrate such as a sapphire substrate.

In particular, the substrate 510 may be a gallium nitride substrate. In this case, the gallium nitride substrate may be a polar substrate, a non-polar substrate, or a semi-polar substrate, as described with reference to FIG. 1.

The semiconductor stacks 600 are disposed on the substrate 510. As shown in FIG. 8, a plurality of semiconductor stacks 600 may be divided by a cell dividing region 600a on a single substrate 510. Each of the semiconductor stacks 600 includes gallium nitride semiconductor layers and, particularly, may include a first nitride semiconductor layer 560, an active layer 570 and a second nitride semiconductor layer 580. The first nitride semiconductor layer 560, active layer 570 and second nitride semiconductor layer 580 are the same as the first nitride semiconductor layer 160, active layer 170 and second nitride semiconductor layer 180 described with reference to FIG. 1, and repeated descriptions thereof will thus be omitted.

The insulation structure 540 is disposed between the substrate 510 and the semiconductor stack 600, and electrically insulates the semiconductor stacks 600 from the substrate 510. The insulation structure 540 may electrically insulate the plurality of semiconductor stacks 600 from the substrate 510.

The insulation structure 540 includes a mask pattern 530 having mask regions and open regions, and a cavity 550a in each of the open regions of the mask pattern 530. The mask pattern 530 may be a convex pattern or a concave pattern. For example, the mask regions of the mask pattern 530 may have a certain shape such as a stripe shape, a circular shape, a rectangular shape, a rhombic shape, a hexagonal shape, or the like. Alternatively, the open regions of the mask pattern 530 may have a certain shape, such as a circular shape, a rectangular shape, a rhombic shape, a hexagonal shape, or the like.

The mask pattern 530 may be formed of an insulating material. The insulating material may be selected from among, for example, $SiO_2$, SiN, MgO, TaO, $TiO_2$ and combinations thereof.

The cavity 550a is an empty space and provides electrical insulation. The cavities 550a are formed in the entirety of the open regions of the mask pattern 530 disposed in a region under the semiconductor stack 600. Accordingly, the semiconductor stack 600 is electrically insulated from the substrate 510 by the mask regions of the mask pattern 530 and the cavities 550a. As shown in FIG. 8, each cavity 550a is at a lower level than the mask pattern 530, and a portion of the cavity 550a is under the mask region so as to overlap the mask region. Thus, a lower surface of the mask region may be exposed to the cavity 550a.

In the present exemplary embodiment, the cavity 550a is under the mask pattern 530 and a side surface of the mask pattern 530 is covered by the first nitride semiconductor layer 560. Alternatively, the side surface of the mask pattern 530 may be exposed to the cavity 550a.

The sacrificial layer 520 may be disposed between the insulation structure 540 and the substrate 510. In other words, the insulation structure 540 may be disposed on the sacrificial layer 520. The sacrificial layer 520 may be formed of a gallium nitride semiconductor, for example GaN, which has a Si doping concentration ranging from $1E17/cm^3$ to $1E19/cm^3$. The sacrificial layer 520 may have a Si doping concentration of $1E18/cm^3$ or greater, or $3E18/cm^3$ or greater.

The cavities 550a are on an upper surface of the sacrificial layer 520 and electrically insulate the first conductivity-type semiconductor layer 560 from the sacrificial layer 520, that is, from the substrate 510.

The cell dividing region 600a divides the semiconductor stack 600 into a plurality of cell regions. The cell dividing region 600a may divide not only the semiconductor stack 600 but also the sacrificial layer 520. Although two semiconductor stacks 600 are shown in the present exemplary embodiment, the semiconductor stack 600 may be divided into a greater number of semiconductor stacks by the cell dividing region 600a.

At least one interconnection wire 620 may electrically connect the separated semiconductor stacks 600 to each other. As shown in FIG. 8, the interconnection wire 620 may connect the semiconductor stacks 600 to each other in series. In other words, the interconnection wire 620 is electrically connected at one end thereof to the first nitride semiconductor layer 560 of one semiconductor stack 600, and at the other end thereof to the second nitride semiconductor layer 580 of another semiconductor stack 600. In such a way, two or more semiconductor stacks 600 may be electrically connected to each other, thereby providing a serial array of semiconductor stacks capable of being driven at a desired high voltage on a single substrate 110.

The transparent electrode 590 may be disposed on the semiconductor stack 600, for example, on the second nitride semiconductor layer 580. The transparent electrode 590 is electrically connected to the second nitride semiconductor layer 580. The interconnection wire 220 may be electrically connected at one end thereof to the second nitride semiconductor layer 580 via the transparent electrode 590.

In order to prevent a short circuit between the interconnection wire 620 and the semiconductor stack 600, the insulation layer 610 may be interposed between the semiconductor stack 600 and the interconnection wire 620. In addition, the insulation layer 610 may be interposed between the interconnection wire 620 and the substrate 510 to prevent short circuit between the interconnection wire 620 and the substrate 510.

According to the present exemplary embodiment, the insulation structure 540 provides electrical insulation of the semiconductor stacks 600 from the growth substrate 510. Thus, when a conductive substrate such as a gallium nitride substrate is used as the growth substrate, it is possible to achieve electrical insulation between the semiconductor stacks 600 and the substrate 510. As a result, it is possible to prevent current leakage from the semiconductor stacks 600 to the substrate 510, thereby providing a light emitting device capable of being driven at high voltage by connecting the plurality of semiconductor stacks 600 to each other.

Figure 9:
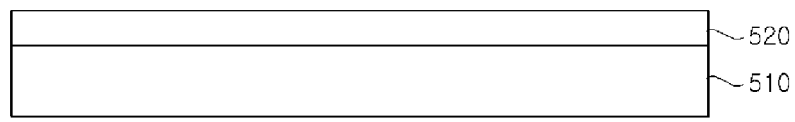
FIGS. 9(a)-(d) and FIGS. 10(a)-(d) are sectional views illustrating a method of fabricating a semiconductor device in accordance with the fourth exemplary embodiment.
Figure 9:
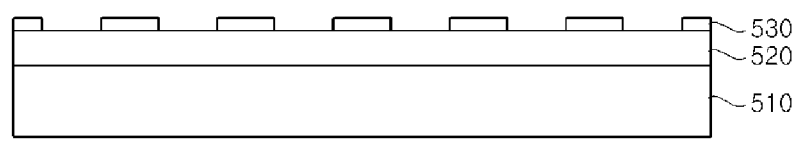
Figure 9:
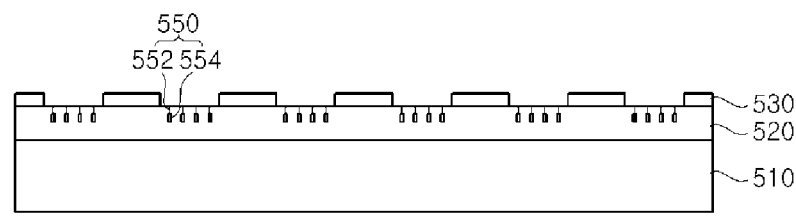
Figure 9:
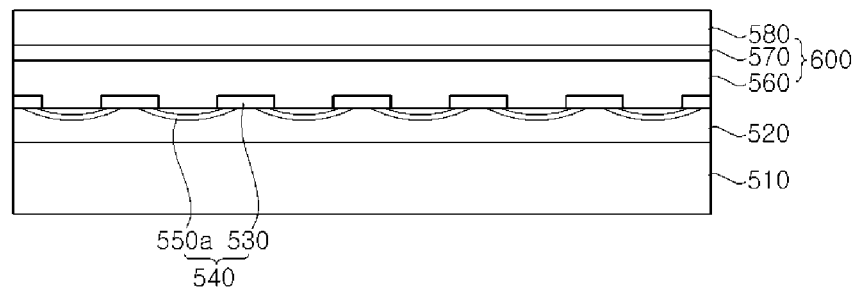

FIG. 9 and FIG. 10 are sectional views illustrating a method of fabricating a semiconductor device in accordance with the fourth exemplary embodiment of the present invention.

First, referring to FIG. 9(a), a growth substrate 510 is prepared. The growth substrate 510 may be a sapphire substrate, a GaN substrate, a silicon carbide (SiC) substrate, a silicon (Si) substrate, or the like. In particular, the growth substrate 510 may be a polar, non-polar, or semi-polar GaN substrate.

A sacrificial layer 520 is formed on the growth substrate 510. The sacrificial layer 520 may be grown on the growth substrate 510 by metal-organic chemical vapor deposition (MOCVD) or molecular beam epitaxy (MBE). The sacrificial layer 520 may have an impurity concentration ranging from $1E17/cm^3$ to $1E19/cm^3$. The sacrificial layer 520 may be formed of a gallium nitride semiconductor layer, for example, a GaN layer, which has a Si doping concentration of $1E18/cm^3$ or more, and have be a Si doping concentration of $3E18/cm^3$ or greater. Nitride-based semiconductor layers described below may also be grown by MOCVD or MBE as in the sacrificial layer 520, and a separate description thereof will be omitted herein.

Figure 11A:
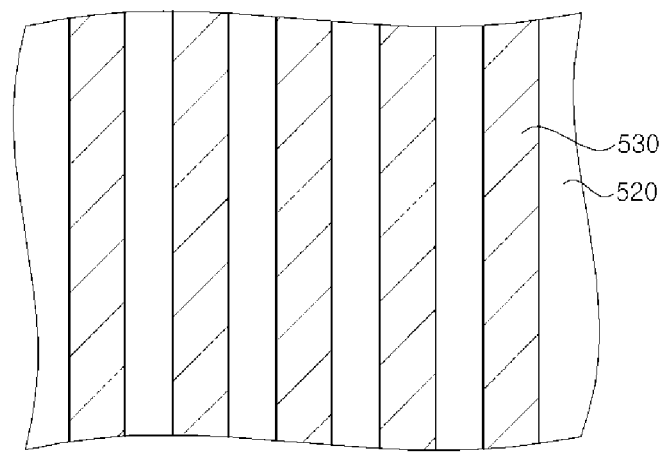
FIGS. 11(a)-(b), FIGS. 12(a)-(b), and FIGS. 13(a)-(b) are plan views of mask patterns in accordance with exemplary embodiments of the present invention.
Figure 11B:
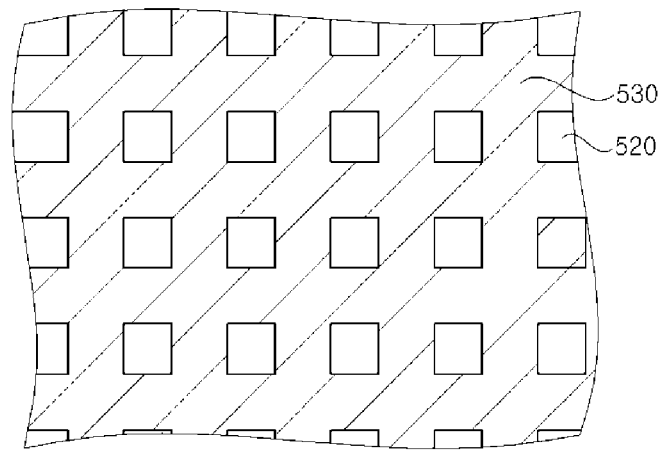
Figure 12A:
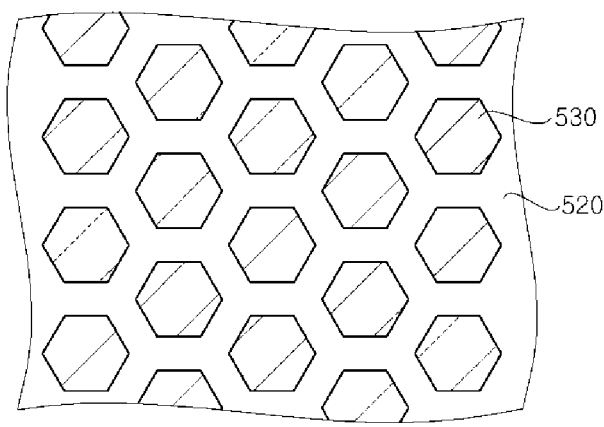
Figure 12B:
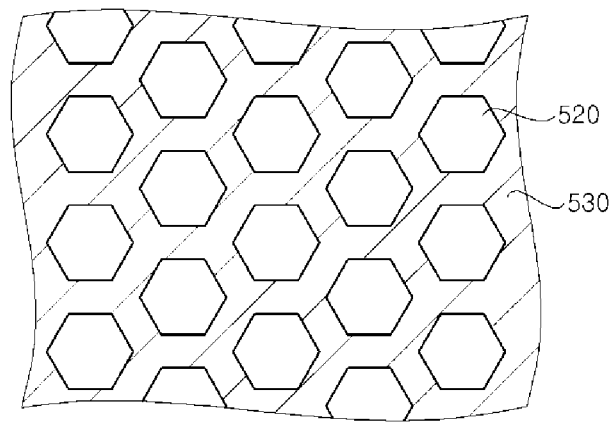
Figure 13A:
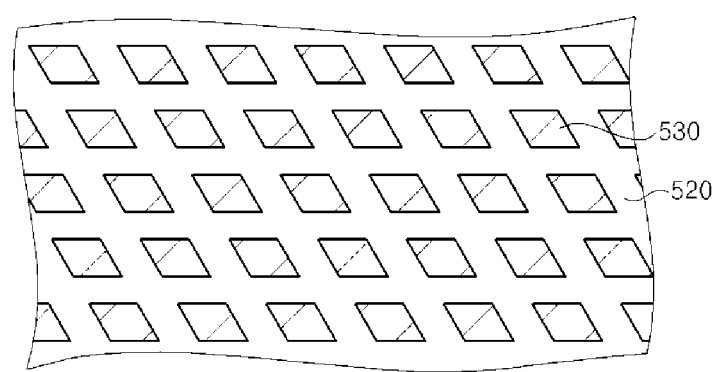
Figure 13B:
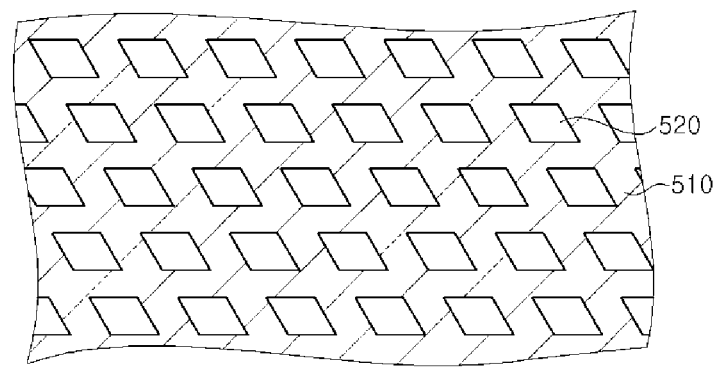

Referring to FIG. 9(b), a mask pattern 530 is formed on the sacrificial layer 520. The mask pattern 530 may be formed of an insulating material, for example, $SiO_2$, SiN, MgO, TaO, $TiO_2$, or combinations thereof. As shown in FIG. 11(a), each of mask regions in the mask pattern 530 may have a stripe shape, and as shown in FIG. 11(b), the mask pattern 530 may have stripes extending in different directions to intersect each other. Alternatively, the mask pattern 530 may be a convex pattern, in which the mask region has a hexagonal shape, as shown in FIG. 12(a), or a rhombic shape as shown in FIG. 13(a). Alternatively, the mask pattern 530 may be a concave pattern, in which the open region has a hexagonal shape, as shown in FIG. 12(b), or a rhombic shape, as shown in FIG. 13(b). The mask pattern 530 may be a convex pattern in which the mask region has a circular or rectangular shape, or a concave pattern in which the open region has a circular or rectangular shape.

Referring to FIG. 9(c), the sacrificial layer 520 is partially etched to create fine pores 550 in the sacrificial layer 520 by electrochemical etching (ECE).

With the growth substrate 510 having the sacrificial layer 520 and a negative electrode (for example, a Pt electrode) dipped in an ECE solution, electro-chemical etching is performed by applying positive voltage to the sacrificial layer 520 and negative voltage to the negative electrode, while adjusting the mole concentration of the ECE solution, processing time, and applied voltage to adjust the size of the fine pores 550.

The ECE solution may be an electrolyte solution containing, for example, oxalic acid, HF, or NaOH.

In the present exemplary embodiment, the sacrificial layer 520 may be partially removed by single-stage electrochemical etching (ECE) through continuous application of a constant voltage, for example, in the range of 10V to 60V, without being limited thereto. Alternatively, the sacrificial layer 520 may be partially removed by two-stage electrochemical etching, in which a lower voltage is initially applied in a first stage and a higher voltage is applied in a second stage. FIG. 9(c) shows fine pores 552, 554 formed by two-stage electrochemical etching, in which fine pores 552 are formed in the first stage by applying a lower voltage, and relatively large fine pores 554 are formed in the second stage by applying a higher voltage. For example, for the sacrificial layer 520 having a Si doping concentration of $6E18/cm^3$ with 0.3M oxalic acid solution at 20° C., electrochemical etching is performed in the first stage by applying a voltage of 8-9V, and in the second stage by applying a voltage of 15-17V.

By two-stage electrochemical etching, relatively good crystallinity can be maintained at the surface of the sacrificial layer 520, and the relatively large fine pores 554 can be created in the sacrificial layer 520, thereby providing advantageous conditions to subsequent processes.

Referring to FIG. 9(d), a nitride semiconductor stack 600 is grown on the sacrificial layer 520 used as a seed layer. Here, the nitride semiconductor stack 600 includes a first nitride semiconductor layer 560, an active layer 570 and a second nitride semiconductor layer 580. The nitride semiconductor stack 600 covers not only the sacrificial layer 520 but also the mask pattern 530 via epitaxial lateral overgrowth.

The first nitride semiconductor layer 560 may be a single layer, or multiple layers. The multiple layers may include an undoped layer and a doped layer.

While the semiconductor stack 600 is grown, the fine pores 552, 554 are combined with each other to create cavities 550a. The cavities 550a are formed to electrically insulate the sacrificial layer 520 from the first nitride semiconductor layer 560 within the open region of the mask pattern 530. In FIG. 9(d), a portion of the sacrificial layer 520 may remain on the cavities 550a. Alternatively, the sacrificial layer 520 on the cavities 550a may be completely removed.

Figure 10A:
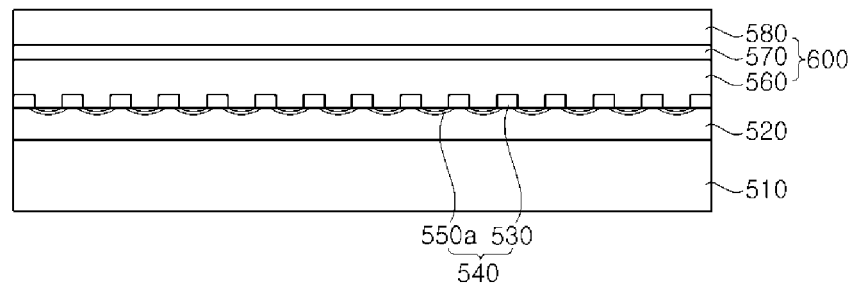

Referring to FIG. 10(a), as described above, during formation of the semiconductor stack 600, the cavities 550a are formed in the sacrificial layer 520 by the fine pores 552, 554 within the sacrificial layer 520. Here, FIG. 10(a) shows the same process as in FIG. 9(d) except for scale.

The first nitride semiconductor layer 560 may be a nitride semiconductor layer doped with a first conductivity-type impurity, for example, a Group III-N based compound semiconductor layer doped with an n-type impurity, such as an (Al, In, Ga)N based nitride semiconductor layer, and may include a gallium nitride layer. In addition, the first nitride semiconductor layer 560 may include an un-doped layer.

The active layer 570 may be a Group III-N based compound semiconductor layer, for example, an (Al, Ga, In)N semiconductor layer, and may have a single quantum-well structure or a multi-quantum well structure having well layers (not shown) and barrier layers (not shown) alternately stacked one above another The second nitride semiconductor layer 580 may be a Group III-N based compound semiconductor layer doped with a second conductivity-type impurity, for example, a p-type impurity, such as an (Al, Ga, In)N-based Group III nitride semiconductor layer, and may include, for example, a GaN layer.

Figure 10B:
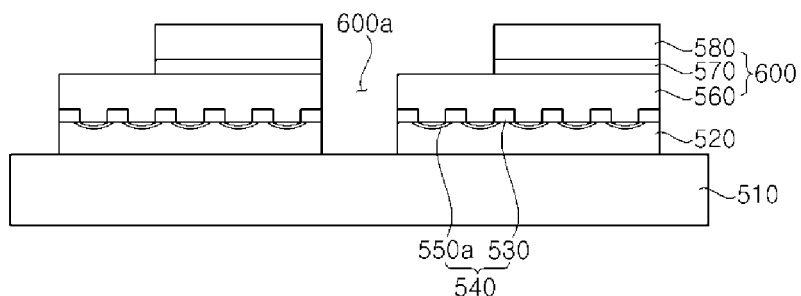

Referring to FIG. 10(b), the grown semiconductor stack 600 is subjected to patterning to form a cell dividing region 600a. The cell dividing region 600a may be formed by photolithography and etching. A plurality of semiconductor stacks 600 is divided into a plurality of cell regions by the cell dividing region 200a.

As shown, the cell dividing region 600a may also divide the sacrificial layer 520, whereby the surface of the substrate 510 can be exposed to the cell dividing region 600a.

In addition, the second nitride semiconductor layer 580 and the active layer 570 in each of the semiconductor stacks 600 are partially etched, allowing partial exposure of an upper surface of the first nitride semiconductor layer 560. The process of exposing the upper surface of the first nitride semiconductor layer 560 may be performed before or after forming the cell dividing region 600*a*.

Referring to FIG. 10(*c*), a transparent electrode layer 590 may be formed on the second nitride semiconductor layer 580. The transparent electrode layer 590 may be formed of a transparent oxide such as ITO, or a metallic material such as Ni/Au.

Here, although the transparent electrode layer 590 is illustrated as being formed after division of the semiconductor stack 600 and partial exposure of the upper surface of the first nitride semiconductor layer 560 in the present exemplary embodiment, the transparent electrode layer 590 may be formed before division of the semiconductor stack 600, and before exposure of the upper surface of the first nitride semiconductor layer 560.

An insulation layer 610 covering side surfaces of the semiconductor stacks 600 may be formed. The insulation layer 610 may also cover the surface of the substrate 510, and may partially cover the transparent electrode layer 590. Here, the insulation layer 610 is formed to expose at least a portion of the upper surface of the first nitride semiconductor layer 560 and at least a portion of an upper surface of the transparent electrode layer 590.

Referring to FIG. 10(*d*), an interconnection wire 620 is formed to connect the semiconductor stacks 600 to each other in series. The interconnection wire 620 is formed on the insulation layer 610, and is insulated from the side surfaces of the semiconductor stacks 600 and the substrate 510. The interconnection wire 620 is electrically connected at one end thereof to the first nitride semiconductor layer 560 of one semiconductor stack 600, and at the other end thereof to the second nitride semiconductor layer 580 of another semiconductor stack 600.

By the interconnection wire 620, the plurality of semiconductor stacks 600 may be connected to each other in various ways. Accordingly, on the single substrate 510, various types of connections, such as series connection, parallel connection, reverse parallel connection, series-parallel combination connection, and the like, may be achieved between the plural semiconductor stacks 200. A semiconductor device having the plurality of semiconductor stacks 600, for example, a light emitting device, may be fabricated by dividing the substrate 510 such that such the plurality of semiconductor stacks 600 can be included therein.

In the present exemplary embodiment, the method of fabricating the semiconductor device having a plurality of semiconductor stacks 600 on a single substrate 510 has been described. However, the present exemplary embodiment may also be applied to fabrication of a semiconductor device having a single semiconductor stack 600 on the substrate 510.

Figure 14:
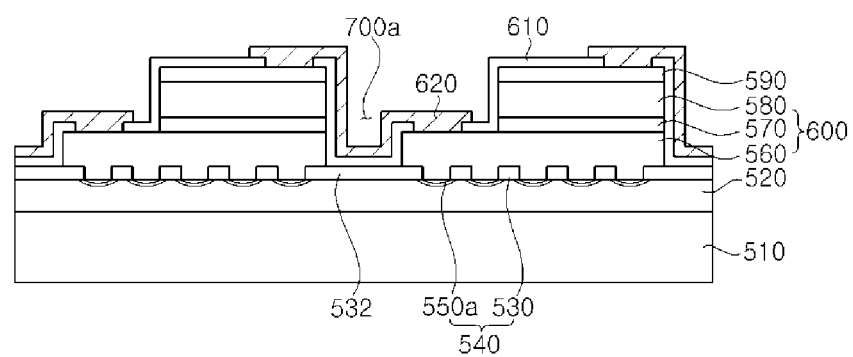
FIG. 14 is a sectional view of a semiconductor device in accordance with a fifth exemplary embodiment of the present invention.

FIG. 14 is a sectional view of a semiconductor device in accordance with a fifth exemplary embodiment of the present invention.

Referring to FIG. 14, the semiconductor device according to the present exemplary embodiment is generally similar to the semiconductor device described with reference to FIG. 8, and has difference in that a dividing mask 532 is disposed on the bottom of a cell dividing region 700*a*. Accordingly, the sacrificial layer 520 may remain in a continuous state instead of being divided by the cell dividing region 700*a*.

The dividing mask 532 may be disposed at the same level as that of the mask pattern 530. That is, the dividing mask 532 may be formed on the sacrificial layer 520, and disposed between semiconductor stacks 600. As shown in FIG. 14, an edge of the dividing mask 532 may be disposed under the semiconductor stacks 600.

As described with reference to FIG. 8, cavities 550*a* are in open regions of the mask pattern 530. In addition, the cavities 550*a* may be in open regions between the mask pattern 530 and the dividing mask 532.

An interconnection wire 620 is electrically insulated from the sacrificial layer 520 by the dividing mask 532. An insulation layer 610 may be further interposed between the dividing mask 532 and the interconnection wire 620.

According to the present exemplary embodiment, since the cell dividing region 700*a* is disposed above the sacrificial layer 520, it is possible to reduce the depth of the cell dividing region as compared with that of the previous exemplary embodiments. Accordingly, the depth of the interconnection wire 620 can be reduced, thereby preventing disconnection of the interconnection wire 620 while increasing the size of the semiconductor stacks 600.

Figure 15A:
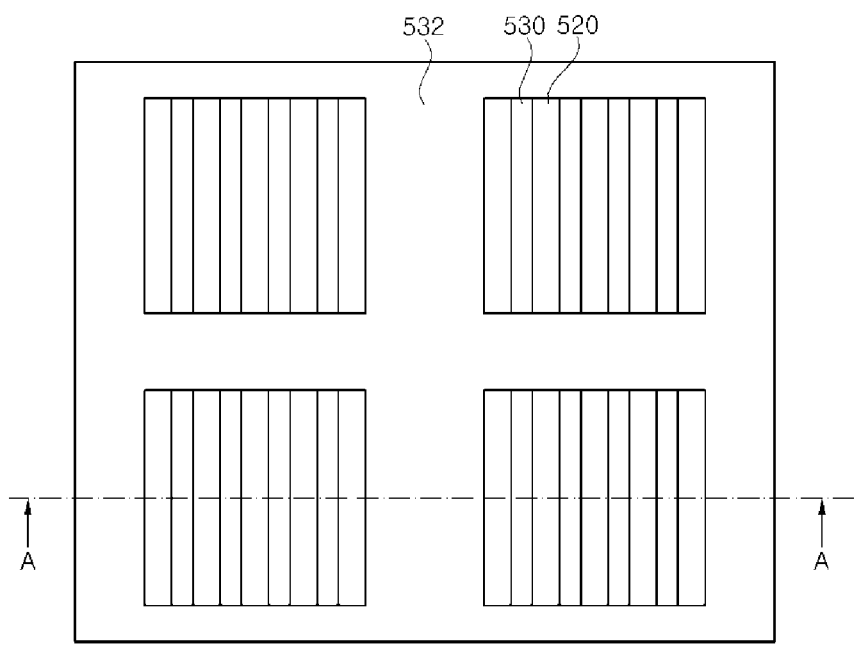
FIGS. 15(a)-(b) and FIGS. 16(a)-(d) are a plan view and sectional views illustrating a method of fabricating a semiconductor device in accordance with the fifth exemplary embodiment.
Figure 15B:
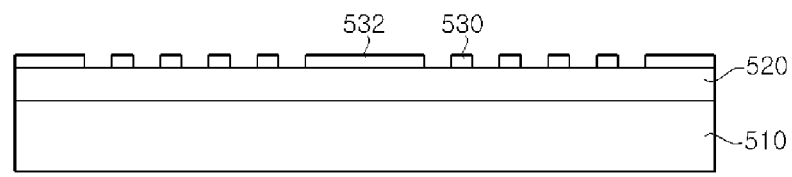

FIG. 15 and FIG. 16 are a plan view and sectional views illustrating a method of fabricating a semiconductor device in accordance with the present exemplary embodiment. Here, FIG. 15(*a*) is a plan view illustrating the mask pattern 530 and the dividing mask 532, and FIG. 15(*b*) is a sectional view taken along line A-A of FIG. 15(*a*).

Referring to FIGS. 15 (*a*) and (*b*), as described with reference to FIG. 8(*a*), a sacrificial layer 520 is formed on a substrate 510. In addition, as described with reference to FIG. 8(*b*), a mask pattern 530 is formed on the sacrificial layer 520. In the present exemplary embodiment, the mask pattern 530 is divided into a plurality of regions. The mask pattern 530 may be divided into the plurality of regions by, for example, the dividing mask 532. The dividing mask 532 may be formed using the same material and by the same process as those of the mask pattern 530. The dividing mask 532 may alternatively be formed of a different insulating material than the mask pattern 530 by a different process.

The dividing mask 532 is formed corresponding to the cell dividing region 700*a* (see FIG. 14), and the mask pattern 530 is formed corresponding to cell regions. Here, although the dividing mask 532 is illustrated as being formed corresponding to the cell dividing region 700*a*, the dividing mask 532 may be formed on a device division region, that is, on a scribing line.

Here, the mask pattern 530 may be a stripe pattern, or a convex or concave pattern, as described with reference to FIG. 8(*b*), and FIG. 11 to FIG. 13.

Referring to FIG. 16(*a*), as described with reference to FIG. 8(*c*), the sacrificial layer 520 exposed to the open region of the mask pattern 530 is partially etched by electrochemical etching (ECE).

Referring to FIG. 16(*b*), a nitride semiconductor stack 600 is grown on the sacrificial layer 520 used as a seed layer. Here, in the present exemplary embodiment, since growth of the nitride semiconductor stack 600 is blocked on the dividing mask 532, the cell dividing region 700*a* is formed on the dividing mask 532 by the process of growing the nitride semiconductor stack 600, so that the nitride semiconductor stack 600 is divided into a plurality of cell regions. That is, the cell dividing region 700*a* is self-aligned by the process of growing the semiconductor stack 600, and a separate patterning process for forming the cell dividing region 700*a* is omitted.

Referring to FIG. 16(*c*), the second nitride semiconductor layer 580 and the active layer 570 in each of the semiconductor stacks 600 are partially etched, allowing an upper surface of the first nitride semiconductor layer 560 to be partially exposed. The second nitride semiconductor layer 580 and the active layer 570 may be etched by photolithography and etching.

Figure 10C:
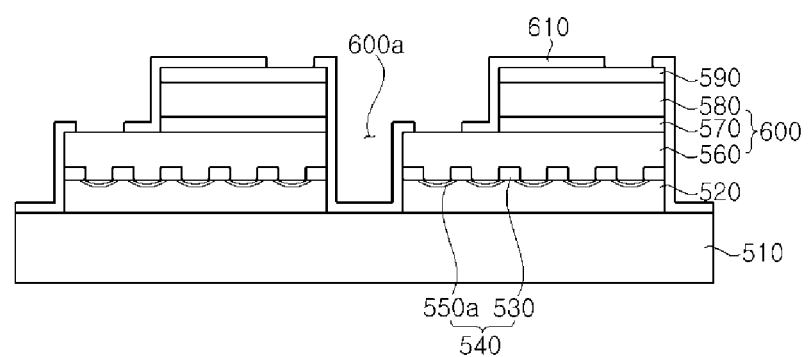
Figure 16A:
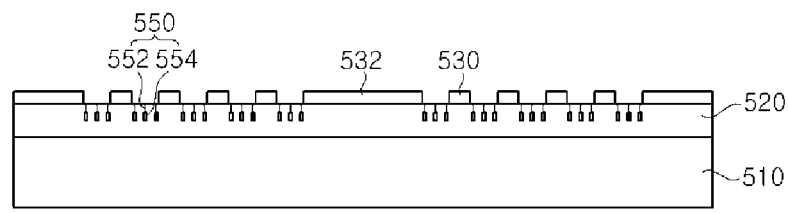
Figure 16B:
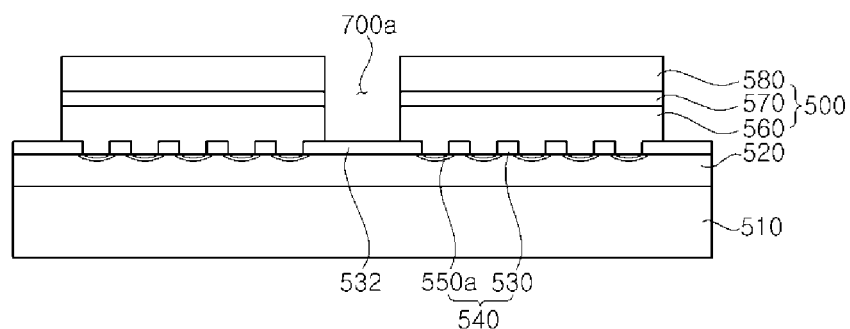
Figure 16C:
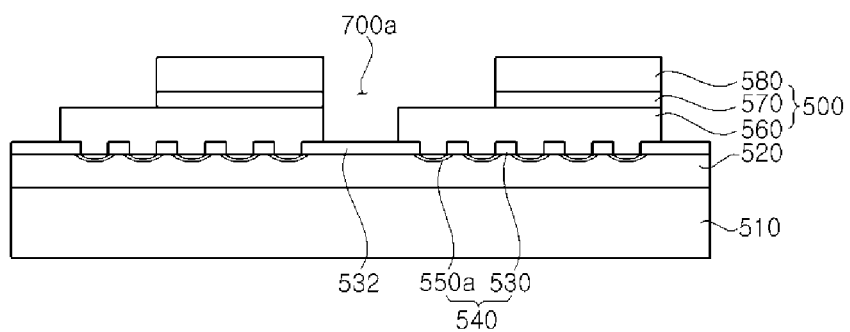
Figure 16D:
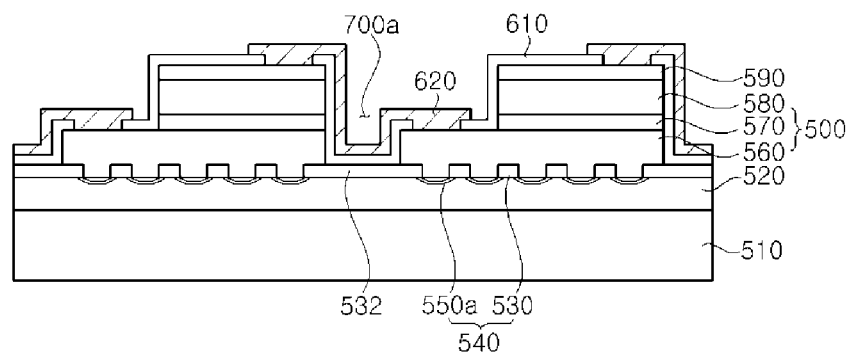

Referring to FIG. 16(d), as described with reference to FIG. 10(c), a transparent electrode layer 590 may be formed on the second nitride semiconductor layer 580. Here, although the transparent electrode layer 590 is illustrated as being formed after partial exposure of the upper surface of the first nitride semiconductor layer 560 in the present exemplary embodiment, the transparent electrode layer 590 may be formed before exposure of the upper surface of the first nitride semiconductor layer 560.

In addition, as described with reference to FIG. 10(c), an insulation layer 610 covering side surfaces of the semiconductor stacks 600 and partially covering the transparent electrode layer 590 may be formed. The insulation layer 610 may also cover the dividing mask 532.

Figure 10D:
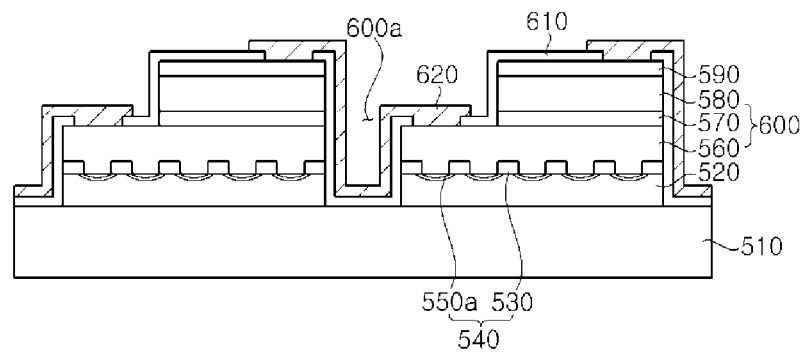

Then, as described with reference to FIG. 10(d), an interconnection wire 620 connecting the semiconductor stacks 600 to each other in series is formed. Here, the dividing mask 532 may be disposed between the interconnection wire 620 and the substrate 510 to isolate the interconnection wire 620 from the substrate 510. In addition, the insulation layer 610 may be disposed between the dividing mask 532 and the interconnection wire 620.

By the interconnection wire 620, the plurality of semiconductor stacks 600 may be connected to each other in various ways. Accordingly, on the single substrate 510, various types of connections, such as series connection, parallel connection, reverse parallel connection, series-parallel combination connection, and the like, may be achieved between the plural semiconductor stacks 200. A semiconductor device having the plurality of semiconductor stacks 600, for example, a light emitting device, may be fabricated by dividing the substrate 510 such that the plurality of semiconductor stacks 600 can be included therein.

According to the present exemplary embodiment, unlike the method of fabricating a semiconductor device described with reference to FIGS. 9 and 10, the method does not need the patterning process for forming the plurality of semiconductor stacks 600. In addition, since the cell dividing region 700a has a smaller depth than the cell dividing region 600a of the above-described embodiment, the interconnection wire 620 can be easily formed. Accordingly, it is possible to increase a light emitting area by relatively reducing the width of the cell dividing region 700a, or to improve luminous efficacy by further slanting the side surfaces of the semiconductor stacks 600.

Figure 17:
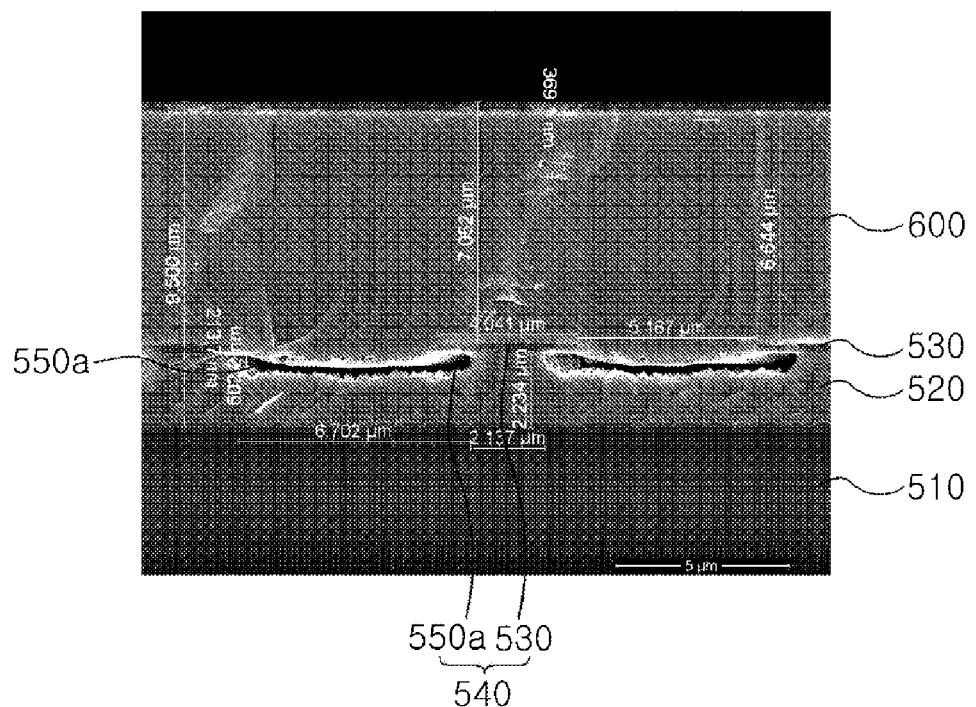
FIG. 17 is a scanning electronic microscope (SEM) image of a cavity formed by electrochemical etching according to an exemplary embodiment of the present invention.

FIG. 17 is a scanning electronic microscope (SEM) image of a cavity 550a formed by electrochemical etching (ECE). Here, a GaN layer having a Si doping concentration of about $6E18/cm^3$ was formed as a sacrificial layer 520 on a gallium nitride substrate 510, and a stripe shaped $SiO_2$ mask pattern 530 having a width of about 4 μm was formed on the sacrificial layer 520. A pitch between stripes of the mask pattern was about 5 μm. Then, electrochemical etching was performed in 0.3M oxalic acid solution at 20° C. by applying a voltage of 8 V in a first stage and a voltage of 15 V in a second stage, followed by growing a gallium nitride semiconductor stack 600 having a thickness of about 6 μm.

As shown in FIG. 17, it can be seen that cavities 550a are formed in open regions of the mask pattern 530 under the mask pattern 530. The semiconductor stack 600 is electrically insulated from the sacrificial layer 520 by the mask pattern 530 and the cavities 550a, and, consequently, is insulated from the substrate 510.

As shown in FIG. 17, a portion of the cavity 550a may extend under the mask region of the mask pattern 530. However, the cavities 550a may be formed in various ways through electrochemical etching. For example, the cavities 550a may be defined only in the open regions of the mask pattern 530.

According to exemplary embodiments of the present invention, a plurality of semiconductor stacks may be electrically insulated from a gallium nitride substrate using an insulation pattern. As a result, it is possible to provide a semiconductor device, particularly, a light emitting device, including a plurality of semiconductor stacks connected to each other in series, while using the gallium nitride substrate as a growth substrate.

In addition, a plurality of semiconductor chips may be electrically insulated from a chip mounting substrate using an insulation layer. As a result, the semiconductor device may block current leakage from the semiconductor chips to the chip mounting substrate, thereby enabling fabrication of various semiconductor packages or semiconductor modules using the plurality of semiconductor chips adopting the gallium nitride substrate.

Further, according to exemplary embodiments of the present invention, the semiconductor stack may be insulated from the substrate using a mask pattern and a cavity. That is, it is possible to block current leakage from the semiconductor stack to the substrate using the mask pattern and the cavity. Thus, it is possible to provide a semiconductor device, particularly, a light emitting device, which includes a plurality of semiconductor stacks connected to each other in series while using an electrically conductive substrate, such as a gallium nitride substrate, as a growth substrate.

Furthermore, since the GaN substrate is used as the growth substrate, the semiconductor stack may exhibit good crystallinity, thereby providing a high efficiency light emitting device. Further, since a non-polar or semi-polar semiconductor stack may be used, it is possible to overcome a limit in optical efficiency due to polarization.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A method of fabricating a semiconductor device, the method comprising:
    forming an insulation pattern comprising a mask region and an open region on a gallium nitride substrate;
    growing gallium nitride semiconductor layers from the open region exposing the gallium nitride substrate to cover the insulation pattern by epitaxial lateral overgrowth (ELOG); and
    patterning the semiconductor layers to form a plurality of semiconductor stacks separated from each other, the plurality of semiconductor stacks being electrically isolated from the gallium nitride substrate by the insulation pattern.

2. The method of claim 1, wherein the insulation pattern comprises $SiO_2$ or SiN.

3. The method of claim 1, wherein patterning the semiconductor layers comprises etching the semiconductor layers to remove them from the open region of the insulation pattern.

4. The method of claim 3, wherein patterning the semiconductor layers further comprises etching the semiconductor layers to divide them in the mask region.

5. The method of claim 1, further comprising forming a plurality of interconnection wires electrically connecting the plurality of semiconductor stacks to each other in series.

6. A method of fabricating a semiconductor device comprising a growth substrate and a gallium nitride semiconductor stack spaced apart from the growth substrate, the method comprising:
    forming a sacrificial layer and a mask pattern on the growth substrate, the mask pattern comprising a mask region and an open region, the sacrificial layer being exposed to the open region of the mask pattern;
    etching the sacrificial layer by electrochemical etching (ECE); and
    growing the gallium nitride semiconductor stack to cover the mask pattern,
    wherein the sacrificial layer comprises a gallium nitride semiconductor layer having a Si doping concentration in a range of $1E17/cm^3$ to $1E19/cm^3$.

7. The method of claim 6, wherein the mask pattern is formed on the sacrificial layer.

8. The method of claim 6, wherein, during formation of the gallium nitride semiconductor stack, a cavity is formed in the sacrificial layer.

9. The method of claim 6, wherein the sacrificial layer is partially etched by application of voltage in at least two stages, and a voltage applied in a first stage is lower than the voltage applied in a second stage.

10. The method of claim 6, further comprising patterning the gallium nitride semiconductor stack to form a plurality of semiconductor stacks spaced apart from each other.

11. The method of claim 10, further comprising a forming a plurality of interconnection wire electrically connecting semiconductor stacks of the plurality of semiconductor stacks to each other in series, respectively.

12. The method of claim 6, further comprising:
    forming a dividing mask dividing the mask pattern into a plurality of regions before growing the gallium nitride semiconductor stack,
    wherein the gallium nitride semiconductor stack grown on the dividing mask comprises a plurality of gallium nitride semiconductor stacks spaced apart from each other.

13. The method of claim 12, wherein the dividing mask is formed together with the mask pattern while the mask pattern is formed.

14. The method of claim 12, further comprising forming a plurality of interconnection wires electrically connecting each semiconductor stack of the plurality of semiconductor stacks to each other in series, respectively.

* * * * *